United States Patent
Zhang et al.

(10) Patent No.: US 8,922,261 B2
(45) Date of Patent: Dec. 30, 2014

(54) LOW NOISE, GLITCH FREE ACCELERATED CONTINUOUS-TIME RAMP GENERATOR

(71) Applicants: Dexue Zhang, Pasadena, CA (US); Rami Yassine, Pasadena, CA (US)

(72) Inventors: Dexue Zhang, Pasadena, CA (US); Rami Yassine, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 0 days.

(21) Appl. No.: 13/948,962

(22) Filed: Jul. 23, 2013

(65) Prior Publication Data

US 2014/0055176 A1 Feb. 27, 2014

Related U.S. Application Data

(60) Provisional application No. 61/675,216, filed on Jul. 24, 2012.

(51) Int. Cl.
*H03K 4/06* (2006.01)
*H03K 4/501* (2006.01)
*H03K 4/00* (2006.01)

(52) U.S. Cl.
CPC . *H03K 4/00* (2013.01); *H03K 4/501* (2013.01)
USPC .......................................................... 327/137

(58) Field of Classification Search
USPC .................................................. 327/131, 137
See application file for complete search history.

(56) References Cited

U.S. PATENT DOCUMENTS

2012/0038809 A1* 2/2012 Lee et al. ..................... 348/308

* cited by examiner

*Primary Examiner* — Daniel Rojas
(74) *Attorney, Agent, or Firm* — Law Office of Scott C. Harris, Inc.

(57) ABSTRACT

A ramp generator circuit, e.g. foreign analog-to-digital converter. The ramp generator circuit has first and second current sources that are maintained in the on condition whether they are being used or not. A switched capacitor connects to the current source in order to create a multi-slope ramp.

6 Claims, 7 Drawing Sheets

Current Reference Generator for Differential Multi-knee Ramp Generator

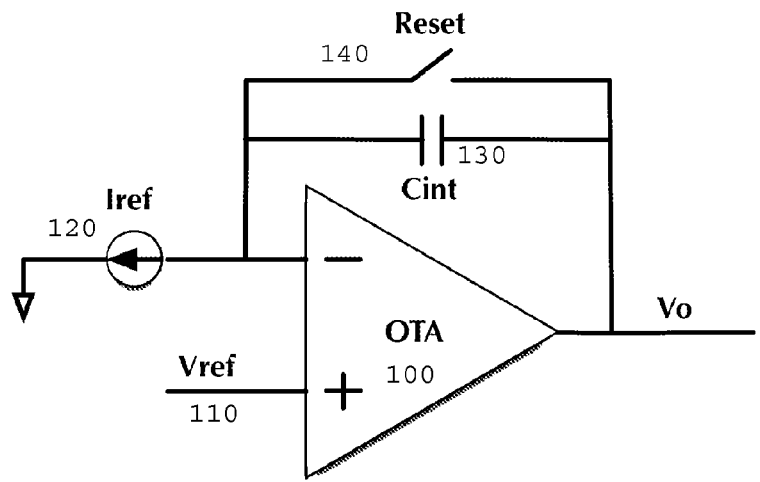
Fig 1. Ramp Generator Based on Continuous-Time Integrator
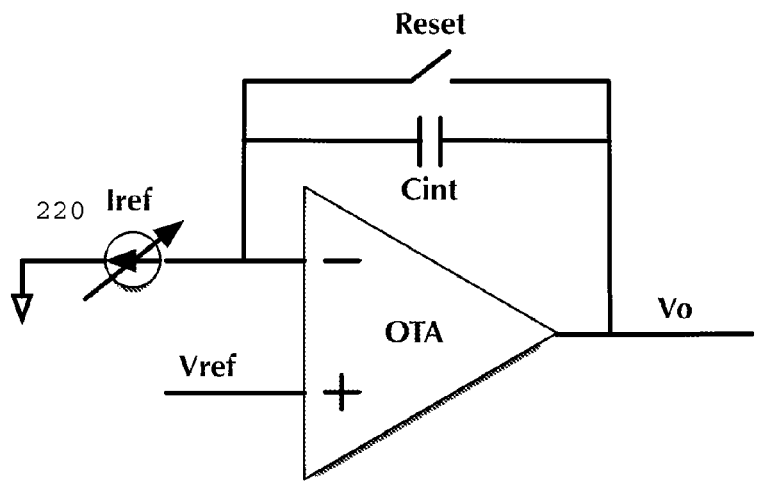
Fig 2. Single-ended Multi-knee Ramp Generator implementation 1

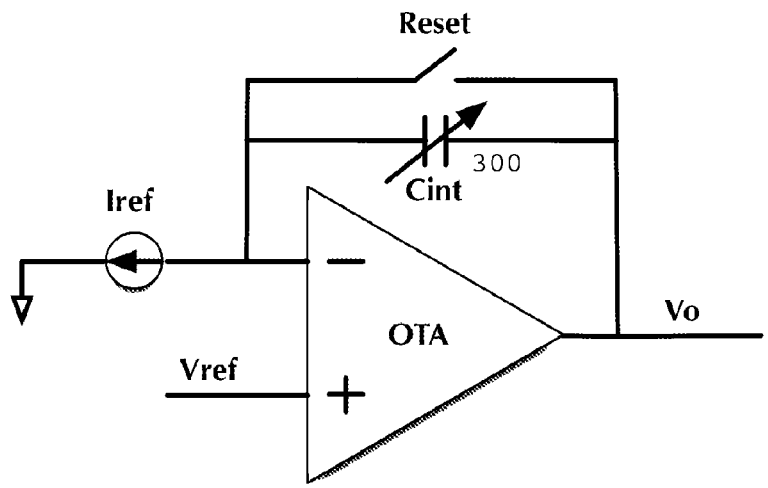
Fig 3. Single-ended Multi-knee Ramp Generator implementation 2
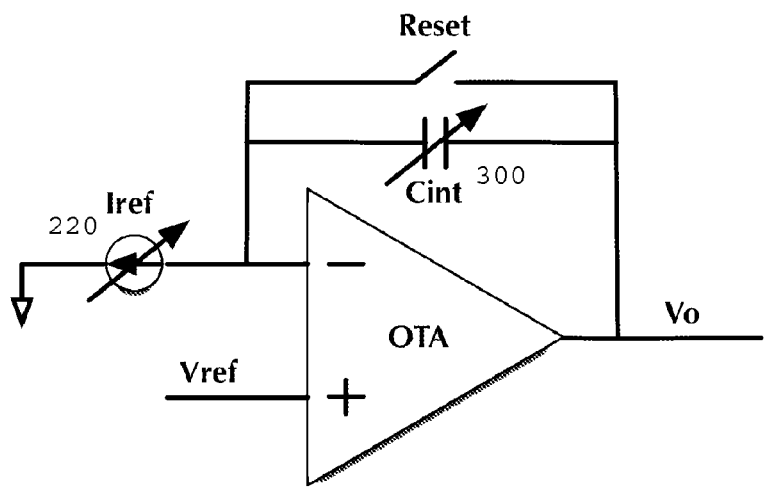
Fig 4. Single-ended Multi-knee Ramp Generator implementation 3

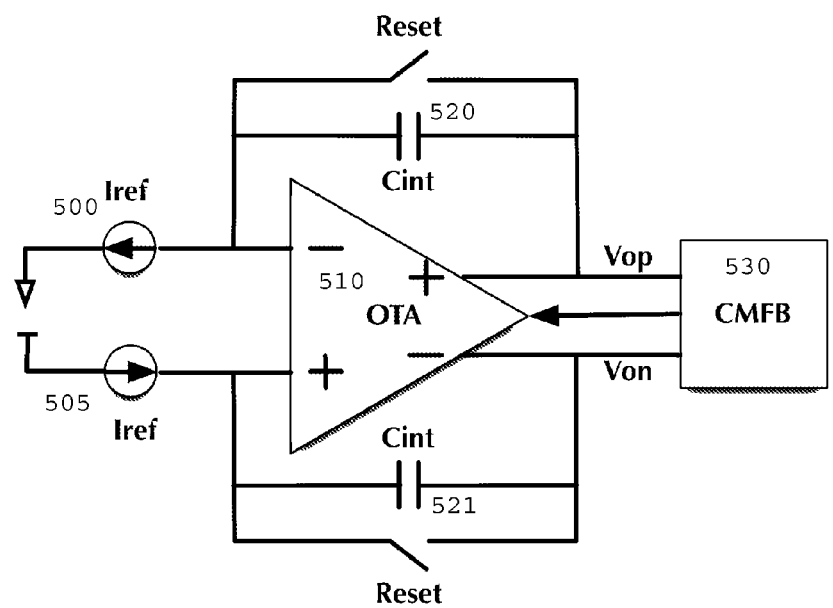
Fig 5. Differential Ramp Generator Based on Continuous-Time Integrator

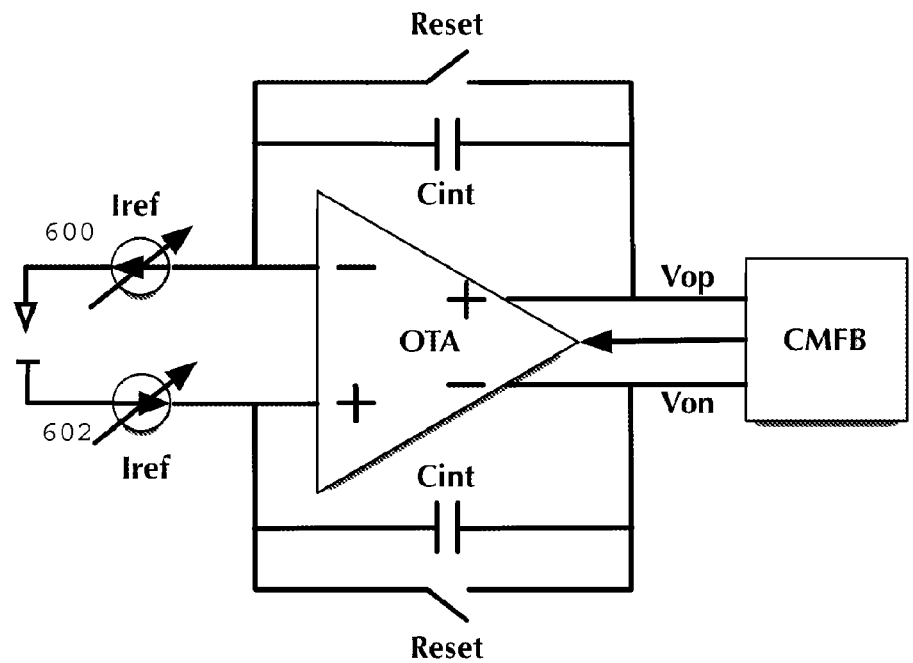
Fig 6. Differential Multi-knee Ramp Generator implementation 1
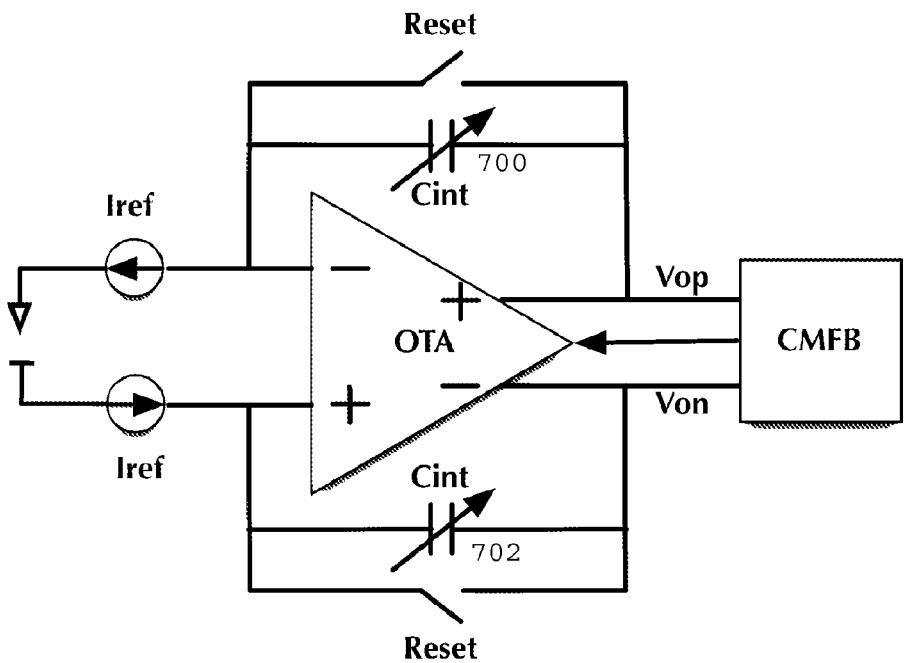
Fig 7. Differential Multi-knee Ramp Generator implementation 2

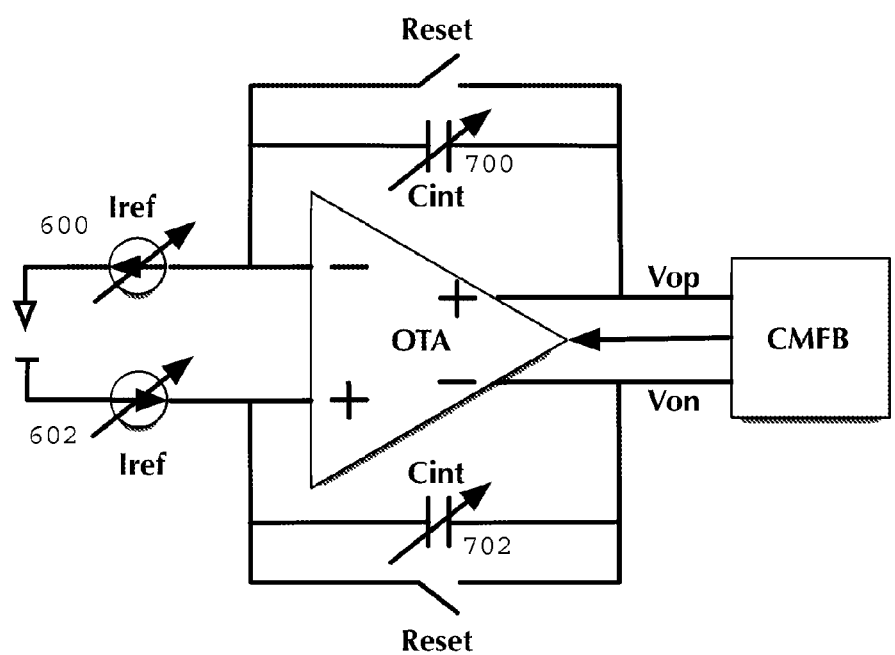
Fig 8. Differential Multi-knee Ramp Generator implementation 3

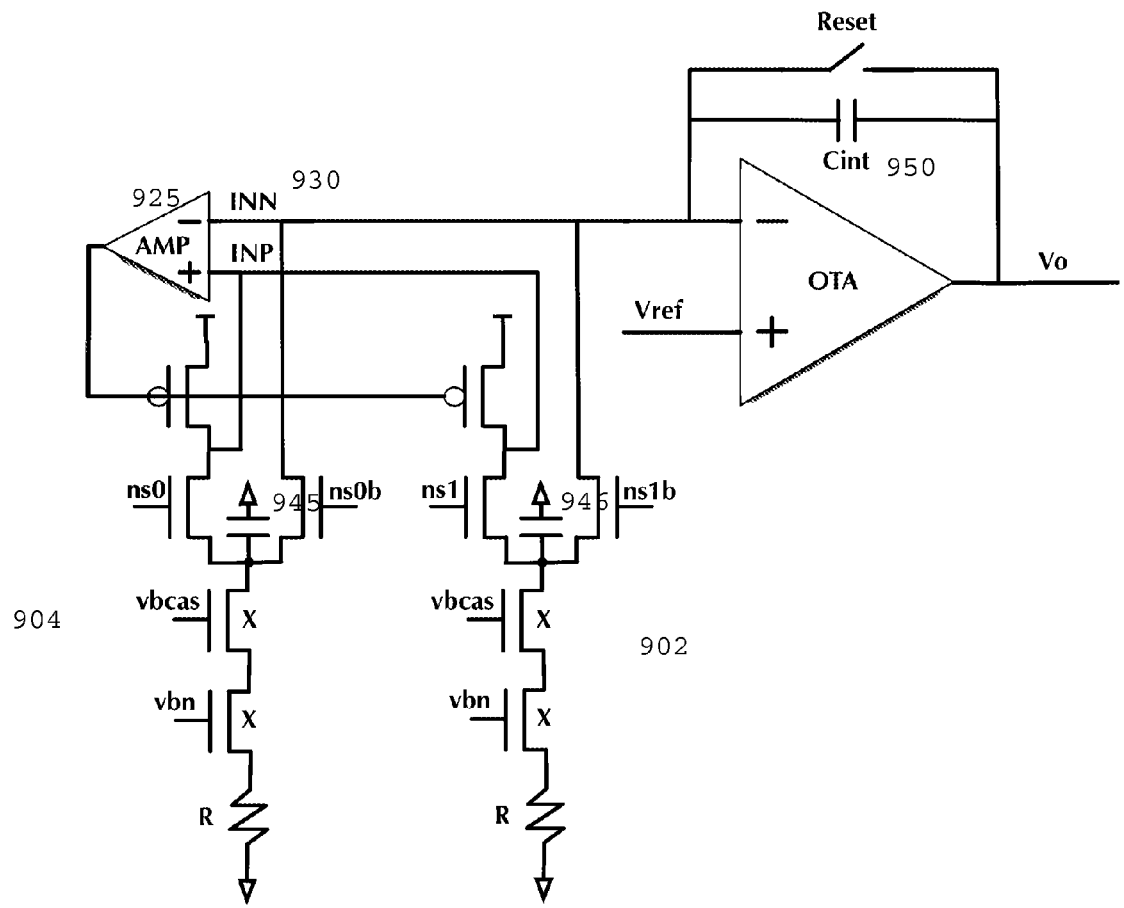
Fig 9. Current Reference Generator for Single-ended Multi-knee Ramp Generator
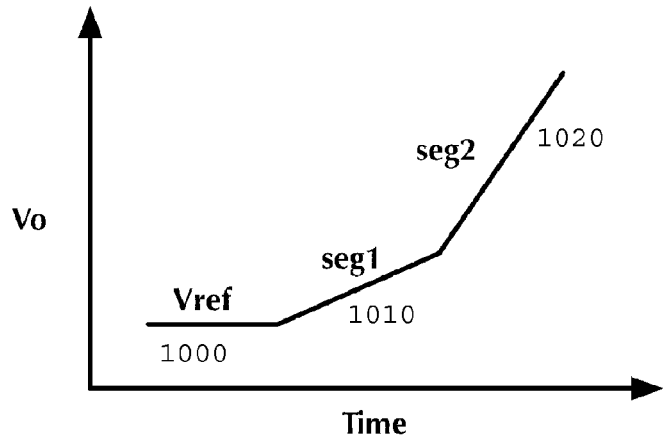
Fig 10 Single-ended Ramp Generator Output

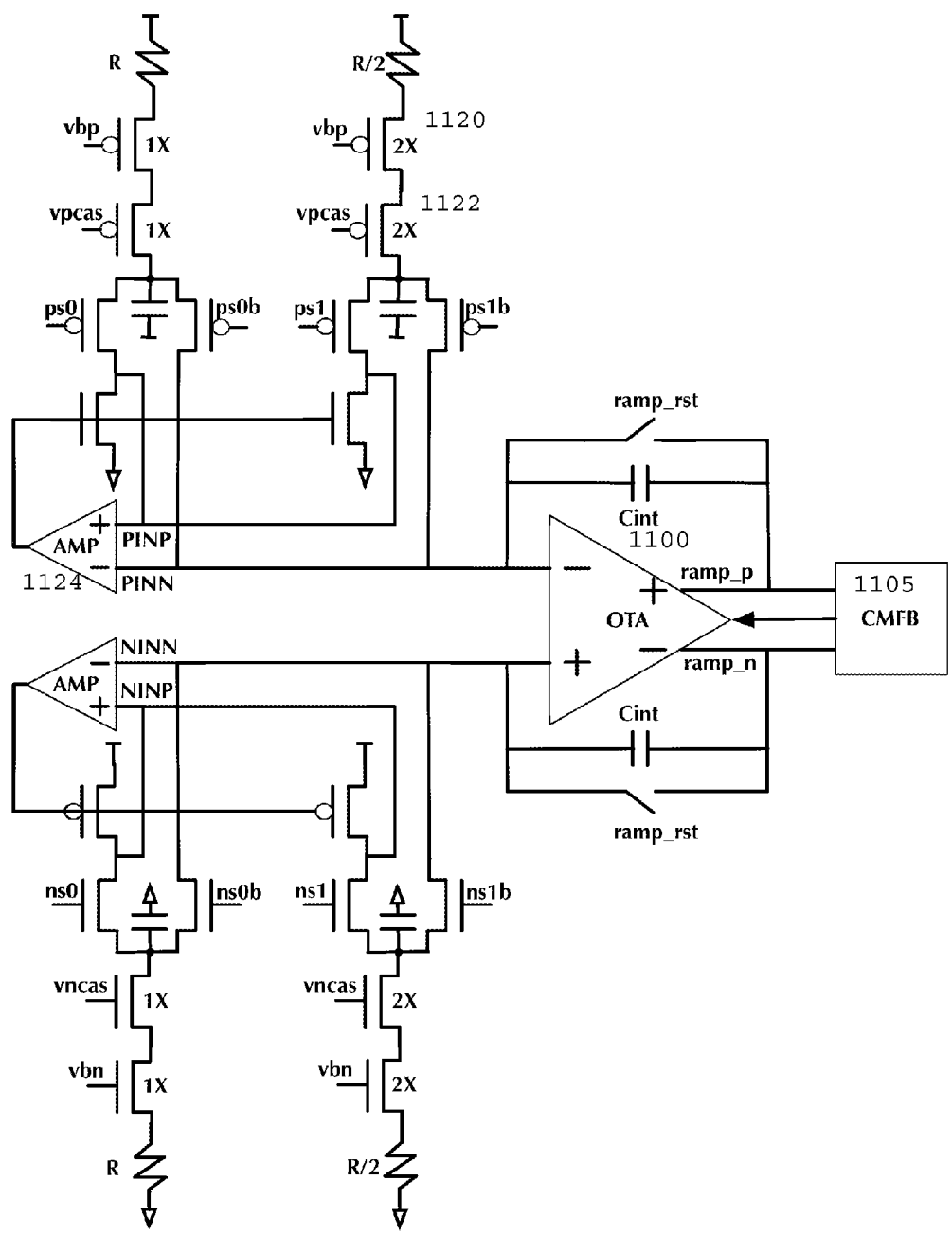
Fig 11. Current Reference Generator for Differential Multi-knee Ramp Generator

US 8,922,261 B2

LOW NOISE, GLITCH FREE ACCELERATED CONTINUOUS-TIME RAMP GENERATOR

This application claims priority from Provisional application number 61675216, filed Jul. 24, 2012, the entire contents of which are herewith incorporated by reference.

BACKGROUND

In recent years, video is required in more places. CMOS image sensors have become more and more popular in such applications as medical instruments, security cameras, mobile phones and automotive industry due to its low power consumption, high speed imaging and easy system integration with on-chip circuits. Among the ADC integration architectures in CMOS image sensors, the column-parallel ADC has become perhaps the most widely used architecture to improve frame rate, reduce power consumption and lower readout noise.

Column-parallel ADC architectures can be further characterized based on the type of ADC used. Types include a successive approximation ADC (SAR), a cyclic ADC and a single-slope ADC (SS). SAR ADCs need to include a DAC that occupies a large silicon area. Hence, this is not a good choice for many applications. Cyclic ADCs can run at ultra-high-speed with the cost of very high power consumption. This becomes a more challenging design specification. SS ADCs have been widely applied in CMOS image sensors because they provide relatively high resolution with minimal area and low power consumption.

For SS ADCs to operate properly, a critical building block "ramp generator" should provide a stable reference to the ADCs. In order to reduce the readout noise, the ramping signal should be as low noise as possible and have good common mode rejection in terms of power and ground bouncing. Therefore, a low noise and differential architecture for ramp generator is very important for modern CMOS image sensors, which employ column-parallel architecture with SS ADCs.

However, one drawback of SS ADCs is their slow conversion speed when bit resolution is increased. In principle, a SS ADCs needs a conversion time of $2^N-1$ clock cycles, where N is the resolution. For example, to complete a 12-bit data conversion, it takes 4,095 clock cycles. Consequently, the row operation time must be longer than 4,095 clock cycles; therefore the frame rate will be low if the pixel array has many columns. CMOS imagers' signal-to-noise ratio is limited by quantum fluctuation of signal electrons. The quantum fluctuation follows Poisson statistics and is termed shot noise, and can be expressed as $$e_{phs} = \text{sqrt}(N) \quad (1)$$

where $e_{phs}$ is the shot noise expressed in rms noise electrons and N is the amount of electrons in the pixel. This shows how shot noise increases with increasing signal. Shot noise often dominates among various noise sources in the large input signal region.

If the quantization step is increased, and quantization noise is kept lower than shot noise, the imaging quality typically will not be affected. A rule of thumb is that quantization noise should be less than half of shot noise to avoid artifacts.

This means that we can complete an effective higher-resolution conversion with less steps and hence the frame rate will be increased, which requires the ramp generator for the SS ADCs to be accelerated.

SUMMARY

In order to accommodate these features, a technique to generate low noise accelerated ramping signal in differential mode is disclosed.

Embodiments describe the implementation of a differential accelerated ramp generator for a single slope ADC used in column parallel image sensor readout.

BRIEF DESCRIPTION OF THE DRAWINGS

In the Drawings:

FIG. 1 shows a ramp generator using a switched capacitor integrator;

FIG. 2 shows a first embodiment of a single ended ramp generator;

FIG. 3 shows a second embodiment of a single ended ramp generator;

FIG. 4 shows a third embodiment of a single ended ramp generator;

FIGS. 5-8 show a differential ramp generators;

FIG. 9 shows a ramp generator with current reference;

FIG. 10 shows a single ended ramp generator; and

FIG. 11 shows an alternative embodiment.

DETAILED DESCRIPTION

This invention describes one way to implement a low noise differential or single-ended accelerated continuous-time ramp generator based on an integrator which utilizes a capacitor and a reset switch.

FIG. 1 shows an ideal Single-ended Ramp Generator based on an integrator. The output of the integrator is given by $$V_o(t) = \frac{A}{A+1}\left(V_{ref} + \frac{1}{C_{int}} \int_0^T I_{ref}(t)\,dt\right) \quad (2)$$

Where, A is the gain of the operational Transconductance Amplifier 100 (OTA), Vref 110 is the voltage reference to set the reset value of the integrator output, Iref 120 is the current reference and Cint 130 is the integration capacitor. In this equation, T is the length of integration time. A reset switch 140 is also provided to reset the value of the integration capacitor.

An embodiment desires to implement an accelerated (multi-knee) ramp generator. This is done according to embodiments as described herein.

One embodiment carries out a variable current reference Iref shown as 220 in FIG. 2.

Another embodiment carries the size of the integration capacitor 300, shown in FIG. 3.

The FIG. 4 embodiment does both, by varying Iref 220 and also changing the value of the integration capacitor 300. Each time one of the values change, either the reference value 220 or the integration capacitor value 300, this changes the slope of the ramp.

Another embodiment uses a Differential Ramp Generator based on an integrator. This embodiment is shown in FIG. 5. The FIG. 5 embodiment carries out improvement of common mode rejection, using a differential operation in its ramp generator. The FIG. 5 embodiment uses first and second differential current references 500 and 505. These current references are input to respective inputs of the operational amplifier 510. The feedback of the operational amplifier is through first and second integration capacitors 520 and 521. A common mode feedback circuit 530 maintains the common mode in the system.

The circuit of FIG. 5 can also be made variable using the embodiments of FIGS. 6, 7 and 8. Again, there are three ways to implement a differential multi-knee ramp generator. FIG. 6 shows the first implementation to change current reference using variable current references 600, 602. FIG. 7 shows the second implementation to change the size of the integration capacitor size using variable capacitors 700, 702. FIG. 8 shows the third implementation to combine the changing of current reference and integration capacitor size using both variable current references and variable capacitors.

A high quality current reference is very critical to a ramp generator, especially when the topology changes the current reference to obtain accelerated ramp signals.

Three major aspects of the current reference generator are very important: low mismatch, high output impedance and glitch free operation.

Low mismatch between the different segments of the accelerated ramp generator is a requirement to ensure the linearity of the ADC. If the mismatch is too large, then the linearity of the ADC will suffer. High output impedance is the general requirement of a current reference, which should be as close as possible to an ideal current source. Since we choose to vary the current reference to get accelerated (multi-knee) ramp signals, if there are big glitches when we add or take out current, the ramp signals around the knees will be distorted and deviate from their ideal positions. The bigger the glitches, the more non-ideality will be introduced around those knees and the ADC linearity will be affected.

FIG. 9 shows an embodiment of a current reference generator for a single-ended two-knee ramp generator and FIG. 10 illustrates the ramp signal that can be generated using this circuit. The ramp as shown as 10 in FIG. 10 includes a first segment 1010 with a first slope, and a second segment 1020 with a second slope that is double the slope of the first segment the slope of that second segment is doubled since the current will be doubled in the second segment.

The circuit shown in FIG. 9 provides improvements to the circuits of FIGS. 1-8. In the circuit shown in FIG. 9, the amplifier 925 has special current sources 902 and 904 attached to its inputs 930, 931 respectively. However, these current sources are configured such that the current sources never turn off. In this embodiment, when switch ns0b or ns1b are on, the current will flow through the integration capacitor Cint 950 for integrating. When switches ns0 and ns1 are on, the current will flow directly from the power supply. That is, whether the current source is needed or not, it is continually maintained in the on condition. Keeping the current source always working can prevent transient effects, which would deviate the knees from their ideal position.

A source degenerated current source is used to improve matching, and mismatch between branches can be reduced to less than 0.1%. The current source used also provides a cascode current mirror structure as shown, which can improve the output impedance of the current source and improve matching.

The circuit of FIG. 9 uses local feedback with an amplifier 925 to keep its two inputs INN 930 and INP 931 to be equal regardless of the process, voltage and temperature variations (PVT) so that there is no charge sharing to occur when current is switched from one side to the other side. Since there is no charge sharing, the outputs are in essence glitch free and the generated ramp signals are as close as possible to ideal around their knee across PVT variation. This circuit and its local feedback reduces the circuit sensitivity to PVT variations The capacitors 945 and 946 provide two functionality, one is to further reduce current glitches if there is any, and secondly to create a zero in the frequency plane together with the on resistors of the switches so that the local feedback is stable. Since there is a local negative feedback loop created by the amplifier 925 this raises loop stability issues to be considered.

The capacitor and the on resistor of the switches create a zero (opposite to a pole) which helps to stabilize the feedback loop. If more knees are needed in the ramp signals, this can be done by just adding more current branches in the circuit with proportional sizes of transistors, resistors and capacitors.

FIG. 11 is an example implementation of a current reference generator for a differential ramp generator. As in the FIG. 9 embodiment, this uses current sources such as 1120, with a current mirroring cascode structure 1122 that maintains the current source always-on in all configurations, and a local amplifier 1124 that stabilizes the current sources to prevent charge sharing. Again, more current branches can be added to generate more knees in the ramp signals. In order to implement a differential ramp generator, the OTA 1100 in FIG. 11 is made differential. A Common Mode Feedback circuit (CMFB) 1105 is used to stabilize the common mode of the differential OTA. One more feedback loop was added based on FIG. 9 to create the differential integrating current for the integrator to generate the differential ramp signals.

Low Noise Ramp Generator

Adding proper load capacitors at the output of the ramp generator to limit the circuit bandwidth is an effective way to generate low noise ramp signals. The combination of the load capacitor and the transconductance of the OTA determines the circuit bandwidth; for a given transconductance, if the load capacitor is too small, then the circuit bandwidth becomes too big and thermal noise might increase. In this case, the load capacitor can be increased to reduce thermal noise while maintaining a certain bandwidth so that the ramp generator can work properly at certain speed. Depending on the application, the size of the capacitor could be changed from tens of pF to 100-200 pF.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other kinds of circuits can be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A ramp generator circuit, comprising:
   multiple current sources and/or sinks;
   an integrating capacitor and reset switch, creating ramp outputs having multiple different slopes from the multiple different current sources and/or sinks; and
   where said multiple current sources and/or sinks are configured to be selectively connected and disconnected from an integrating node during operation, to generate a continuous ramp output with varying slope; also where said multiple current sources and/or sinks are always on, and are switched between a first configuration in which a current flowing out of the current source or in to the current sink is used to create the ramp and a second configuration in which the current is output but not integrated to create the ramp.

2. The ramp generator circuit as in claim 1, wherein said ramp generator circuit is single ended.

3. The ramp generator circuit as in claim 1, wherein said ramp generator circuit is differential.

4. The circuit as in claim 1, further comprising the local feedback part which maintains the output voltage on the disconnected current sources and sinks, such that the local feedback reduces transient effects and glitches when connecting or disconnecting current sources/sinks from the integrating nodes.

5. The circuit as in claim 1, further comprising a local feedback circuit that improves the current matching between said multiple current sources by maintaining the output voltage across the current sources/sinks.

6. The circuit as in claim 1, further comprising an analog-to-digital converter, and wherein said ramp is used as part of the analog-to-digital converter.

* * * * *